(12) United States Patent
Nagano et al.

(10) Patent No.: US 9,041,182 B2
(45) Date of Patent: May 26, 2015

(54) SEMICONDUCTOR PACKAGE AND METHOD OF MANUFACTURING THE SAME

(71) Applicants: Toshihiko Nagano, Kanagawa (JP); Kazuhide Abe, Kanagawa (JP); Hiroshi Yamada, Kanagawa (JP); Kazuhiko Itaya, Kanagawa (JP); Taihei Nakada, Kanagawa (JP)

(72) Inventors: Toshihiko Nagano, Kanagawa (JP); Kazuhide Abe, Kanagawa (JP); Hiroshi Yamada, Kanagawa (JP); Kazuhiko Itaya, Kanagawa (JP); Taihei Nakada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 13/688,823

(22) Filed: Nov. 29, 2012

(65) Prior Publication Data

US 2013/0256864 A1      Oct. 3, 2013

(30) Foreign Application Priority Data

Mar. 29, 2012   (JP) ................. 2012-075518

(51) Int. Cl.
*H01L 23/48*    (2006.01)
*H01L 21/78*    (2006.01)
(Continued)

(52) U.S. Cl.
CPC .............. *H01L 23/48* (2013.01); *H01L 21/78* (2013.01); *H01L 23/055* (2013.01); *H01L 23/10* (2013.01); *H01L 23/66* (2013.01); *H01L 2224/73253* (2013.01); *H01L 2224/81895* (2013.01); *H01L 24/13* (2013.01); *H01L 24/16* (2013.01); *H01L 24/17* (2013.01); *H01L 24/81* (2013.01); *H01L 24/97* (2013.01); *H01L 2224/05644* (2013.01);
(Continued)

(58) Field of Classification Search
USPC ......... 257/690, 678, 691, 692, 698, 708, 704, 257/710, E23.001, E23.031, E23.02, 257/E23.022
See application file for complete search history.

(56) References Cited

U.S. PATENT DOCUMENTS 5,723,904 A * 3/1998 Shiga .......................... 257/698
2002/0041016 A1 4/2002 Hyodo et al.
2008/0042227 A1 2/2008 Asano et al.

FOREIGN PATENT DOCUMENTS

JP    1-272140      10/1989
JP    06-268020 A    9/1994
(Continued)

OTHER PUBLICATIONS

Office Action issued Jun. 10, 2014 in Japanese Patent Application No. 2012-075518 (with English language translation).
(Continued)

*Primary Examiner* — Timor Karimy
(74) *Attorney, Agent, or Firm* — Oblon, McClelland, Maier & Neustadt, L.L.P.

(57) ABSTRACT

A semiconductor package according to embodiments includes: a semiconductor chip including a front electrode on a front surface thereof and a back electrode on a back surface thereof; a front-side cap portion including an air gap in a portion between the semiconductor chip and the front-side cap portion and a front-side penetrating electrode, and is positioned to face the front surface of the semiconductor chip; a back-side cap portion bonded with a first cap portion to hermetically seal the semiconductor chip, includes an air gap at least in a portion between the semiconductor chip and the back-side cap portion and a back-side penetrating electrode, and is positioned to face the back surface of the semiconductor chip; a front-side connecting portion which electrically connects the front electrode and the front-side penetrating electrode; and a back-side connecting portion which electrically connects the back electrode and the back-side penetrating electrode.

10 Claims, 17 Drawing Sheets

(51) Int. Cl.
*H01L 23/055* (2006.01)
*H01L 23/10* (2006.01)
*H01L 23/00* (2006.01)
*H01L 23/66* (2006.01)

(52) U.S. Cl.
CPC ............ *H01L 2224/0603* (2013.01); *H01L 2224/06181* (2013.01); *H01L 2224/12105* (2013.01); *H01L 2224/13007* (2013.01); *H01L 2224/13111* (2013.01); *H01L 2224/133* (2013.01); *H01L 2224/14181* (2013.01); *H01L 2224/16235* (2013.01); *H01L 2224/81191* (2013.01); *H01L 2224/81192* (2013.01); *H01L 2224/81205* (2013.01); *H01L 2224/814* (2013.01); *H01L 2224/81411* (2013.01); *H01L 2224/81444* (2013.01); *H01L 2224/81447* (2013.01); *H01L 2224/81805* (2013.01); *H01L 2224/81815* (2013.01); *H01L 2224/81986* (2013.01); *H01L 2224/97* (2013.01); *H01L 2924/1515* (2013.01); *H01L 2924/16153* (2013.01); *H01L 2224/05568* (2013.01); *H01L 2224/1329* (2013.01); *H01L 2924/1461* (2013.01)

(56) References Cited

FOREIGN PATENT DOCUMENTS

| JP | 2000-058686 A | 2/2000 |
| JP | 2002-118192 A | 4/2002 |
| JP | 2007-027211 A | 2/2007 |
| JP | 3917649 | 2/2007 |
| JP | 2008-130601 A | 6/2008 |

OTHER PUBLICATIONS

Japanese Office Action dated Mar. 17, 2015, issued in counterpart Japanese patent application No. 2012-075518, with English translation, citing document AO therein (10 pages).

* cited by examiner

US 9,041,182 B2

SEMICONDUCTOR PACKAGE AND METHOD OF MANUFACTURING THE SAME

CROSS-REFERENCE TO RELATED APPLICATION

This application is based upon and claims the benefit of priority from Japanese Patent Application No. 2012-075518, filed on Mar. 29, 2012, the entire contents of which are incorporated herein by reference.

FIELD

Embodiments described herein relate generally to a semiconductor package and a method of manufacturing the same.

BACKGROUND

In order to satisfy a demand for the higher performance of an electronic apparatus, besides scaling-down and multiple functions of each device chip itself, as an influential means, the improvement in additional values may be exemplified which is introduced by complexing applications based on the integration of a plurality of chips having various functions. For example, in a case where a wireless communication apparatus is added with a new application, as a valid aspect, it may be considered that analog processing circuits for wireless communication and digital circuits for signal processing are consolidated into one chip. For the realization of the above aspect, various requirements for design specifications exists, in particular, requirements for a technology of constructing a package of the device chip and, requirements for a technology of mounting the chips.

Specifically, in a case of mounting a high-frequency semiconductor chip or a power semiconductor chip, since the strength of signals passing through the chip is great (several Watts or more) or the frequencies of the signals are high (several GHz or more), and electrical impedance matching or a reduction in insertion loss are necessary, a large number of requirements for the mounting technology are present. For this reason, there have been many problems in design and processes for making a package and then a module.

In the related art, as an example of a widely-used configuration, each of the semiconductor chips is sealed in a package material made of metal, ceramic, or a complex of these and then the chips are configured to be mounted on a printed circuit board and the like as a module together with other elements such as passive components. For example, a high-frequency chip called an MMIC (Monolithic Micro wave Integrated Circuit) is needed to combine the electrical impedance matching between input and output units with the reduction in insertion loss of electric signals. In order to satisfy the need, a package material including metal, ceramic, or a complex of these is subjected to die bonding with a material such as Au and Au (Sn), subjected to wire bonding with Au wires and the like, and hermetically sealed, thereby being completely formed as one package. The packages formed in this way are mounted on a printed circuit board through soldering, wire bonding, and the like together with capacitors, inductors, resistors, and the like, and thus the high-frequency modules are completed as a system.

However, since the ranges of usable frequencies are wide by several digits and even the types of transferable power vary depending on the high-frequency semiconductor chips, it is necessary to select the package and the mounting method which are suitable to the corresponding usage environment. Further, in a case where a plurality of the semiconductor chips having different functions are formed in a package or a module, regarding the scaling down and high integration of the package itself, there is a request for constructing a new mounting technology in which the package can be configured without using a large-scaled ceramic package or the like.

In addition, in a case of the power semiconductor chip, since a large amount of heat generation is accompanied, there is a request for a material and a package structure excellent in thermal conductivity for wasting the generated heat. For this reason, there is a strong demand for the development of a mounting technology in order to realize the power semiconductor chip using a small-size and low cost package.

DETAILED DESCRIPTION

Figure 1:
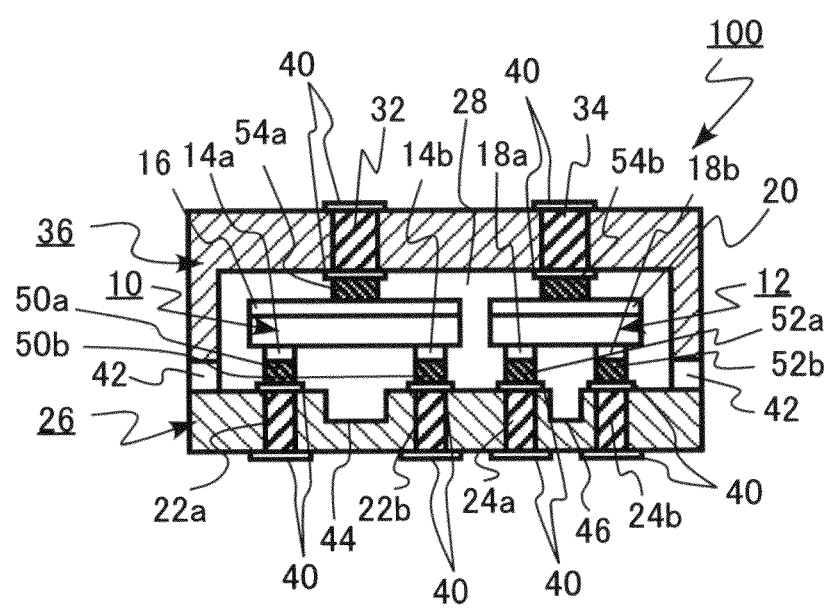
FIG. 1 is a cross-sectional view schematically illustrating a semiconductor package according to an embodiment.

A semiconductor package according to an embodiment includes: a semiconductor chip which includes a front electrode on a front surface thereof and a back electrode on a back surface thereof; a front-side cap portion which includes an air gap at least in a portion between the semiconductor chip and the front-side cap portion and a front-side penetrating electrode, and is positioned to face the front surface of the semiconductor chip; a back-side cap portion which is bonded with the front-side cap portion to hermetically seal the semiconductor chip, includes an air gap at least in a portion between the semiconductor chip and the back-side cap portion and a back-side penetrating electrode, and is positioned to face the back surface of the semiconductor chip; a front-side connecting portion which electrically connects the front electrode and the front-side penetrating electrode; and a back-side connecting portion which electrically connects the back electrode and the back-side penetrating electrode.

A semiconductor package according to another embodiment includes a first semiconductor chip which includes a first front electrode on a front surface thereof and a first back electrode on a back surface thereof and a second semiconductor chip which includes a second front electrode on the front surface and a second back electrode on the back surface. Then, the semiconductor package includes a front-side cap portion which includes an air gap at least in a portion between the first and second semiconductor chips and first and second front-side penetrating electrodes, and is positioned to face the front surface of the first and second semiconductor chips. In addition, the semiconductor package includes a back-side cap portion which is bonded with the front-side cap portion to hermetically seal both the first and second semiconductor chips in the same hollow portion, includes an air gap at least in a portion between the first and second semiconductor chips and first and second back-side penetrating electrodes, and is positioned to face the back surfaces of the first and second semiconductor chips. Furthermore, the semiconductor package includes first and second front-side connecting portions which electrically connect the first and second front electrodes and the first and second front-side penetrating electrodes, respectively, and first and second back-side connecting portions which electrically connect the first and second back electrodes and the first and second back-side penetrating electrodes.

In the semiconductor package according to embodiments, the connection to the front or back electrode is realized by a penetrating electrode in the cap portion which is provided on the both surfaces sides of the semiconductor chip. Therefore, the potential applied to the semiconductor chip becomes stable, and thus a stable electric characteristic is realized.

In particular, in a case where the electrode is a ground electrode, if the ground is not stably realized, insertion loss may be largely deviated from an ideal characteristic. In addition, also a frequency characteristic may be unstable. According to the embodiments, the stable ground is realized, and thus the electrical characteristic becomes stable and an improvement in reproducibility and reliability is realized. The sealing structure of the embodiments effectively suppresses crosstalk between wirings and intrusion of noise from outside, by having low permittivity space between a semiconductor chip and cap portion. It is especially effective for a semiconductor chip that handles high frequency signals and its package. And, in case penetrating electrodes are used, not only a package that can suppress insertion loss but also a package that reduce noise can be achieved, by shortening wiring length of wires that transmit signals. An impedance matching between inside and outside of a device is important in designing transmission line. The embodiment enables reduction of harmful influence to impedance matching by making wiring length short. In addition, because the semiconductor chip is packaged in low permittivity space, a design margin for wiring length, wiring width, and wiring thickness etc. can be enlarged. Therefore, the package of the embodiment is quite effective for enlargement of design margin for whole system.

FIG. 1 is a cross-sectional view schematically illustrating a semiconductor package according to an embodiment. A semiconductor package 100 is configured to include a first semiconductor chip 10 and a second semiconductor chip 12 packaged therewithin. The first and second semiconductor chips 10 and 12, for example, are high-frequency semiconductor chips for processing signals indifferent frequency bands such as an MMIC (Monolithic Micro wave Integrated Circuit).

The first semiconductor chip 10 includes first front electrodes 14a and 14b on the front surface thereof and a first back electrode 16 on the back surface thereof. The first back electrode 16, for example, is the ground electrode.

The second semiconductor chip 12 includes the second front electrodes 18a and 18b on the front surface thereof and a second back electrode 20 on the back surface thereof. The second back electrode 20, for example, is the ground electrode.

The semiconductor package 100 hermetically seals the first and second semiconductor chips 10 and 12 using a front-side cap portion 26 and a back-side cap portion 36. An air gap is created or exists at least in a portion between the front-side cap portion 26 and the front surfaces of the first and second semiconductor chips 10 and 12. In addition, the front-side cap portion 26 includes the first and second front-side penetrating electrodes 22a, 22b, 24a, and 24b. Then, the front-side cap portion 26 is positioned to face the front surfaces of the first and second semiconductor chips 10 and 12. In FIG. 1, the air gaps are created in areas except those corresponding to the first and second front electrodes 14a, 14b, 18a, and 18b and the first and second front-side penetrating electrodes 22a, 22b, 24a, and 24b.

In addition, the back-side cap portion 36 is bonded to the front-side cap portion 26 to hermetically seal the first and second semiconductor chips 10 and 12 in the same hollow portion 28. Then, the air gap is created or exists at least in a portion between the back-side cap portion 36 and the first and second semiconductor chips 10 and 12. In addition, the back-side cap portion 36 includes first and second back-side penetrating electrodes 32 and 34. Then, the back-side cap portion 36 is positioned to face the back surface of the first and second semiconductor chips 10 and 12. In FIG. 1, the air gap is created in areas except those between the first and second back electrodes 16 and 20 and the first and second back-side penetrating electrodes 32 and 34.

At least some parts of the front-side cap portion 26 and the back-side cap portion 36, for example, are formed of high-resistive silicon. The front-side cap portion 26 and the back-side cap portion may be formed of high-resistive materials having the resistivity of 100 Ωcm or more, which is preferable from the viewpoint of reducing the insertion losses of the first and second semiconductor chips 10 and 12. Examples of materials for the front-side cap portion 26 and the back-side cap portion 36 may include glass, metal, resin, oxide, or a complex of these in addition to the silicon.

The first and second front-side penetrating electrodes 22a, 22b, 24a, and 24b, and the first and second back-side penetrating electrodes 32 and 34 may be formed of a material such as copper (Cu) and copper alloy, or a material containing Cu, which is preferable from the viewpoint of reducing the electrical resistance. Other metallic materials also may be employed.

End surfaces of the first and second front-side penetrating electrodes 22a, 22b, 24a, and 24b, and the first and second back-side penetrating electrodes 32 and 34 are provided with barrier metal layers 40 to prevent oxidation. The barrier metal layer 40, for example, includes a laminated structure of nickel (Ni) and gold (Au).

The front-side cap portion 26 and the back-side cap portion 36 are bonded by a bonding portion 42. The bonding portion 42, for example, may be formed using resin, solder, or the like. If there is a need to secure an insulating property, it is preferable to employ the high-resistive material such as the resin.

Concave portions 44 and 46 are provided in the areas of the front-side cap portion 26 where a first semiconductor chip 10 and a second semiconductor chip 12 face each other. The concave portions 44 and 46 serve to secure a distance between the first and second semiconductor chips 10 and 12 and the front-side cap portion 26, so that an effect that the insertion loss is reduced can be obtained. From the viewpoint of the reduction in insertion loss, the distance between the first and second semiconductor chips 10 and 12 and the front-side cap portion 26 is preferably 10 μm or more.

The semiconductor package 100 includes first front-side connecting portions 50a and 50b which electrically connect the first front electrode 14a and 14b and the first front-side penetrating electrodes 22a and 22b. In addition, the semiconductor package 100 includes second front-side connecting portions 52a and 52b which electrically connect the second front electrode 18a and 18b and the second penetrating electrodes 24a and 24b.

Furthermore, the semiconductor package 100 includes a first back-side connecting portion 54a which electrically connects the first back electrode 16 and the first back-side penetrating electrode 32. Then, the semiconductor package 100 includes a second back-side connecting portion 54b which electrically connects the second back electrode 20 and the second back-side penetrating electrode 34.

Figure 2A:
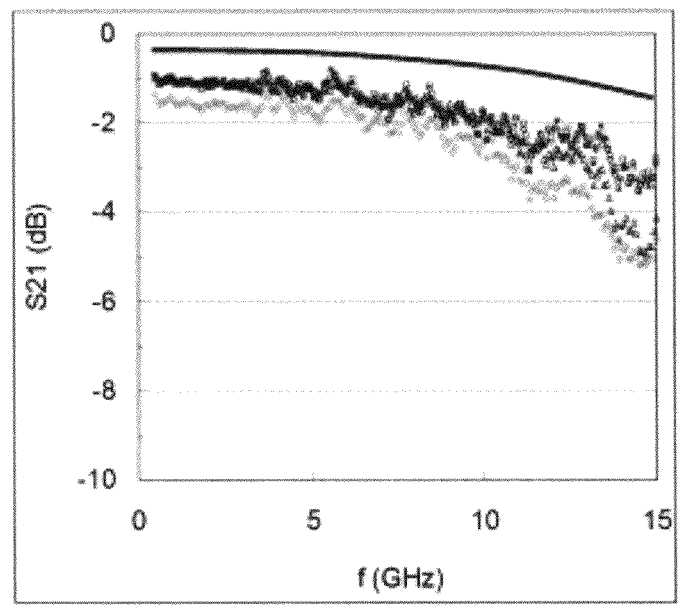
FIGS. 2A and 2B are diagrams illustrating insertion loss in a case where a ground voltage is applied to a back electrode serving as a ground electrode by a penetrating electrode in a semiconductor chip from the front surface.
Figure 2B:
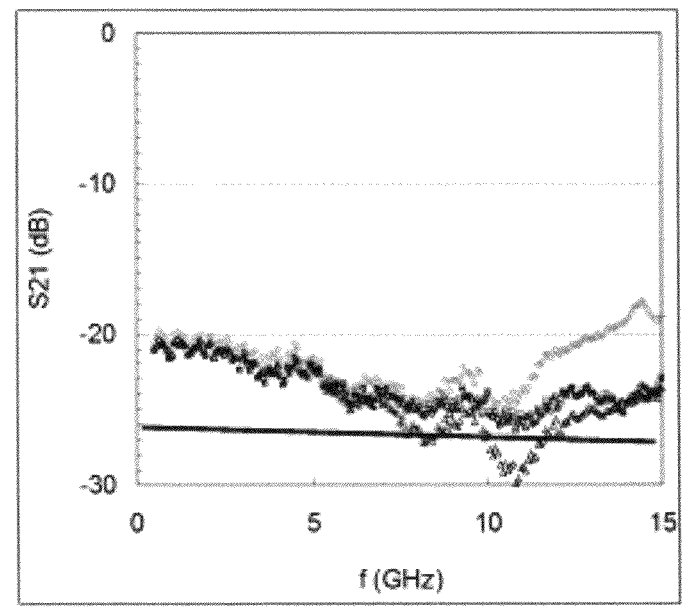

FIGS. 2A and 2B are diagrams illustrating the insertion losses in a case where a ground voltage is applied to the back electrode serving as the ground electrode by the penetrating electrode in the semiconductor chip from the front surface. FIG. 2A illustrates the insertion loss when signals are passing through, and FIG. 2B illustrates the insertion loss when the signals are blocked out. The horizontal axis represents a signal frequency, and the vertical axis represents an S-parameter $S_{21}$. The solid line draws ideal characteristics in a case where the ground voltage is stable.

In a case where the ground voltage is applied from the front surface side of the semiconductor chip, it is difficult to make the ground stable. For this reason, as is obvious from the drawing, it can be seen that the insertion loss is significantly deviated from the ideal characteristics. Therefore, it may not be able to realize the desired electrical characteristics of the semiconductor chip.

In the embodiment, for example, the voltage is applied to the back electrode serving as the ground electrode by the penetrating electrode which is provided in the second semiconductor chip 36. Therefore, it is possible to realize a contact having low resistance against the back electrode. Accordingly, the voltage can be stably supplied and the insertion loss becomes less, so that the stable device characteristics can be obtained.

In addition, for example, in a case where the silicon cap portion is hermetically sealed using a metal bonding portion such as solder, the sealing performance against moisture and chemical solutions is improved compared with the case of using the resin for sealing. Therefore, the reliability of the device can be improved.

In addition, according to the embodiment, the first and second semiconductor chips 10 and 12 are packaged in the hollow portion 28 without being in contact with a high-permittivity resin. Therefore, it is possible to suppress the loss due to the contact with the resin and to prevent the consistency in impedance from being deviated from the designed value.

In addition, according to the embodiment, for example, the radiation property is also improved compared with the case where the back surface of the semiconductor chip is hermetically sealed using the resin. In a case where the sealing is performed using the resin, since the thermal conductivity of the resin is low, the heat discharging property is remarkably degraded. In the embodiment, there is no resin on the back surface of the semiconductor chip. Then, the heat generated from the back electrode 20 is discharged through the first back-side connecting portion 54a and the back-side penetrating electrode which have high thermal conductivity. Therefore, the device is suppressed from being raised in temperature during the operation, and thus it is possible to realize the stable device characteristics. In particular, in a case where the semiconductor chip is a power semiconductor chip, the desired device characteristics can be easily realized because of the high radiation performance.

In addition, the semiconductor package according to the embodiment can be manufactured through the preceding processes for the semiconductor, that is, those used in a wafer processes such as sputtering and forming films, plating, lithography, wet etching, and dry etching. Therefore, it is possible to perform packaging without using a resin formation process which is high in process cost. Accordingly, it is possible to manufacture a high-performance semiconductor package at a low cost.

Next, a method of manufacturing a semiconductor package according to an embodiment will be described. FIGS. 3A to 3F, FIGS. 4A to 4E, and FIGS. 5A and 5B are cross-sectional views illustrating processes for explaining a method of manufacturing the semiconductor package according to the embodiment.

Figure 3A:
FIGS. 3A to 3F are cross-sectional views for explaining steps in a method of manufacturing a semiconductor package according to an embodiment.

At the beginning, the forming of the front-side cap portion will be described. First, a first high-resistive silicon wafer 60 is prepared (FIG. 3A). The thickness of the wafer, for example, is about 100 to 400 μm.

Figure 3B:

Next, through holes 62 are formed in the first high-resistive silicon wafer 60 for forming the penetrating electrodes (FIG. 3B). For the formation of the through hole, for example, a D-RIE (Deep Reactive Ion Etching) is employed. For example, after a resist is patterned using a typical photolithography technique, the wafer is subjected to plasma treatment while letting $SF_6/C_4F_8$ gases flow alternatively from a mass flow controller into a process chamber, that is, the Bosch process can be employed.

Next, the resist and a fluoride passivation film of the first high-resistive silicon wafer 60 are removed. Thereafter, a thermally-oxidized film of 1 μm (not illustrated) is formed on the entire surface of the wafer using a thermal oxidation furnace in which the oxidation is performed with water vapor. Next, a seed layer (not illustrated) to be used in plating with copper is formed. Then, for example, a metal thin film (not illustrated) composed of 100 nm of titanium (Ti) and 100 nm of copper (Cu) is formed on the first high-resistive silicon wafer 60 having the through hole formed therein using a sputtering method.

Figure 3C:
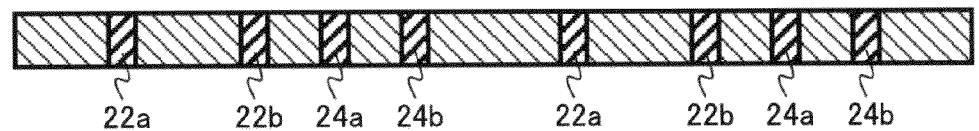

Next, the first and second front-side penetrating electrodes 22a, 22b, 24a, and 24b are formed through electrolytic plating with Cu (FIG. 3C). Regarding the plating, Cu is formed to have a surface thickness of about 50 μm through the electrolytic plating using a cupric sulfate solution, and the surplus Cu layer remaining on the surface of the substrate is removed through a process such as a mechanical grounding, a lithography, and an etching.

Figure 3D:
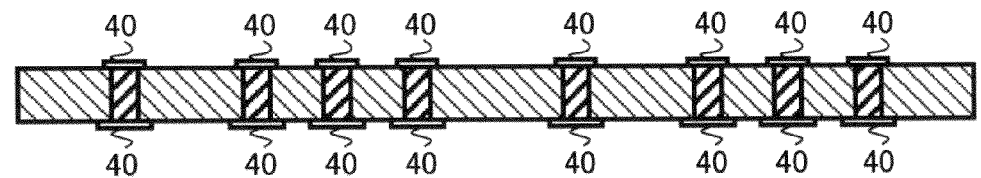

Next, in order to prevent the Cu layer formed in a cap structure on the front and back surfaces of the penetrating electrodes from being oxidized, a Ni layer is formed to have about 1 μm through the electrolytic plating or non-electrolytic plating before the formation of Au bumps. Further, an Au layer is formed to have about 0.1 μm on the Ni layer through a flash plating, thereby forming the barrier metal layer 40 (FIG. 3D).

Figure 3E:

Next, the first high-resistive silicon wafer 60 is subjected to the lithography and an RIE to form the concave portions 44 and 46 (FIG. 3E). The depth of the concave portion, for example, is 50 μm.

Thereafter, the Au bump is formed on the first front electrodes 14a and 14b of the first semiconductor chip 10 and the second front electrodes 18a and 18b of the second semiconductor chip 12. The radius and height of the bump are determined depending on a bonding height to be controlled in the subsequent process according to a requirement. The height up to the top of the bump, for example, is set to about 50 μm.

Figure 3F:
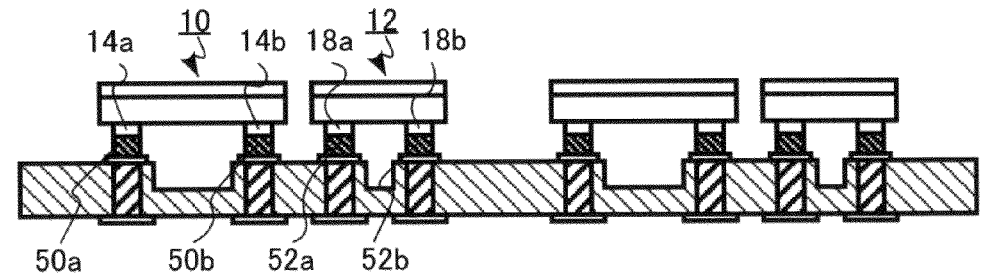

Thereafter, a paste containing Au and Sn is formed to have a thickness of about 20 μm on the barrier metal layer 40, the chips with the Au bumps formed thereon are mounted using a mounter and then the bonding is performed in a temperature range from 250° C. to 300° C. through a reflow process using a reflow furnace. Therefore, the first and second front-side connecting portions 50a, 50b, 52a, and 52b are formed, and the first semiconductor chip 10 are mounted on the first high-resistive silicon wafer 60 (FIG. 3F). At this time, since the first semiconductor chip is supported by the first and second front-side connecting portions 50a, 50b, 52a, and 52b, the air gap is formed between the first and second semiconductor chips 10 and 12 and the first high-resistive silicon wafer 60.

Further, Au is exemplified as another option of the metal layer used for the bonding of the front-side connecting portion, which can be generally formed by soldering with Sn—Ag—Cu, a bonding of Au—Au using ultrasonic waves, a bonding using the reaction between conductive polymer and metal, a thermal bonding between a metal layer formed in a Si cap and a pad of an MMIC chip, and the like. Examples of the bonding material and the bonding method are listed in Table 1.

TABLE 1

| Metal material for bonding | Bonding method | Bonding conditions | Note |
|---|---|---|---|
| Si—Au | Direct bonding | 1: Forming Au on one side (Electrolytic plating) 2: Bonding using mounter, pressurizing (5 MPa) 3: Forming bonding portion (Max. temp: 360° C., 10 Min in total) | High temperature and high pressurization are needed |
| Au—Au | Ultrasonic bonding | 1: Forming Au (electrolytic plating) 2: Bonding using mounter, pressurizing (1 MPa) 3: Forming bonding portion (Max. temp: 150° C., ultrasonic power 1 W, 30 Sec in total) | Ultrasonic application is compulsory for bonding |

TABLE 1-continued

| Metal material for bonding | Bonding method | Bonding conditions | Note |
|---|---|---|---|
| Au—AuSn | Eutectic bonding | 1: Forming Au, and Au—Sn (electrolytic plating) 2: Bonding using mounter, pressurizing (1 MPa) 3: Forming bonding portion (Max. temp: 280° C., 5 Min in total) | Heating at high temperature is compulsory for bonding |
| Cu—Cu | Fusion bonding | 1: Forming Cu film (sputtering) 2: Bonding using mounter, pressurizing (2 MPa) 3: Forming bonding portion (Max. temp: 350° C., 30 Min in total) | Heating at high temperature is compulsory for bonding |
| Sn—Ag—Cu | Bump bonding | 1: Forming Sn—Ag—Cu (printing) 2: preliminary heating (200° C., 2 Min) 3: Bonding using mounter, pressurizing (1 MPa) 4: Forming bonding portion (Max. temp: 250° C., 5 Min in total) | Reflowing is compulsory |
| Cu—Sn | Fusion bonding | 1: Forming Sn pad (electrolytic plating) 2: Positioning using flip-chip bonder, pressurizing (1 MPa) 3: Bonding using heater (Max. temp: 280° C., 30 Sec in total) | Heating at high temperature is compulsory for bonding |
| Conductive epoxy resin | Coating, heating | 1: Coating conductive epoxy paste 2: Bonding using mounter 3: Baking in air at 100° C. for 10 Min (temporary burning) 4: Baking in air at 180° C. for 60 Min (main burning) | Bonding can be performed at the lowest temperature, but conductivity is lower than metallic system |

Next, the formation of the back-side cap portion 36 will be described. A method of forming the back-side cap portion 36 is similar to that of the front-side cap portion except that the Au bump is not formed on the back surface of the second semiconductor chip 12.

Figure 4A:
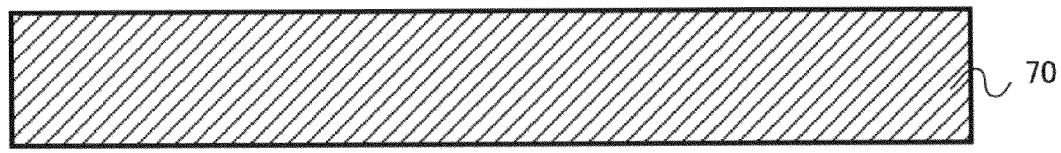
FIGS. 4A to 4E are cross-sectional views for explaining steps in a method of manufacturing a semiconductor package according to an embodiment.

First, a second high-resistive silicon wafer 70 is prepared (FIG. 4A). The thickness of the wafer, for example, is about 100 to 400 μm.

Figure 4B:
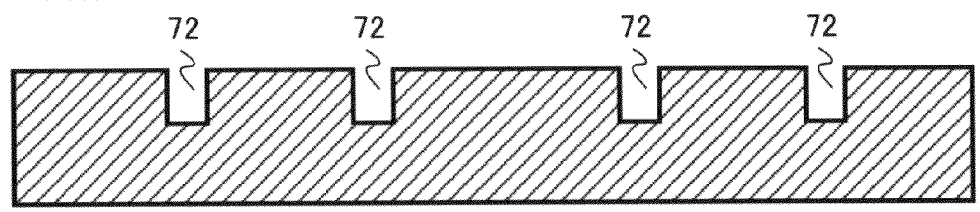

Next, holes 72 for forming the penetrating electrodes are formed in the second high-resistive silicon wafer 70 (FIG. 4B).

Next, a thermally-oxidized film (not illustrated) is formed on the entire surface of the second high-resistive silicon wafer 70. Next, the seed layer (not illustrated) for performing a copper plating is formed. Then, a metal thin film (not illustrated) made of titan (Ti) and copper (Cu) is formed on the second high-resistive silicon wafer 70 with the holes 72 formed therein through the sputtering method.

Figure 4C:
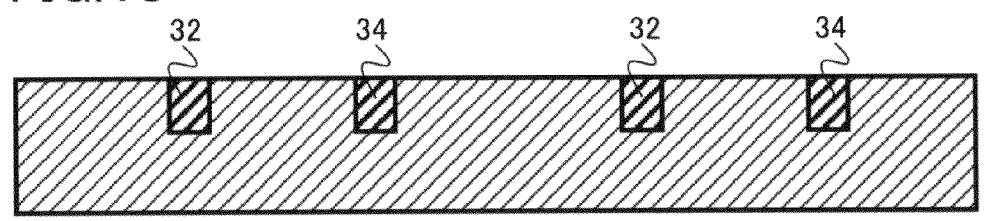

Next, the first and second back-side penetrating electrodes 32 and 34 are formed through the electrolytic plating with Cu (FIG. 4C).

Figure 4D:
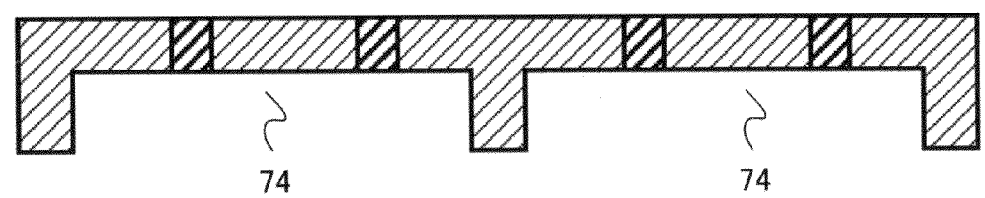

Next, a concave portion 74 is formed in the second high-resistive silicon wafer 70 through the lithography and the RIE (FIG. 4D).

Figure 4E:
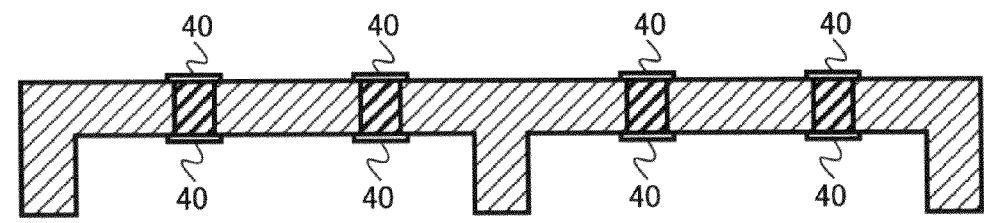

Next, in order to prevent the oxidation of the Cu layer formed in the cap structure on the front and back surfaces of the penetrating electrode, the barrier metal layer 40 is formed (FIG. 4E).

Figure 5A:
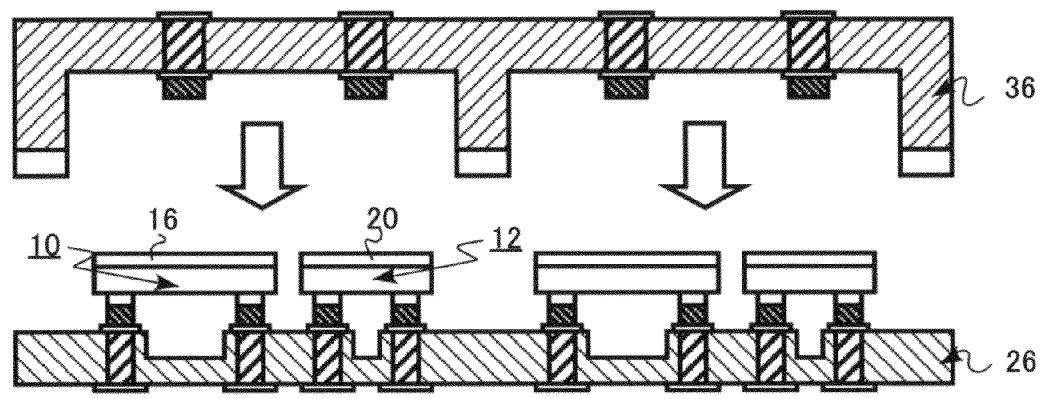
FIGS. 5A and 5B are cross-sectional views for explaining steps in a method of manufacturing a semiconductor package according to an embodiment.
Figure 5B:
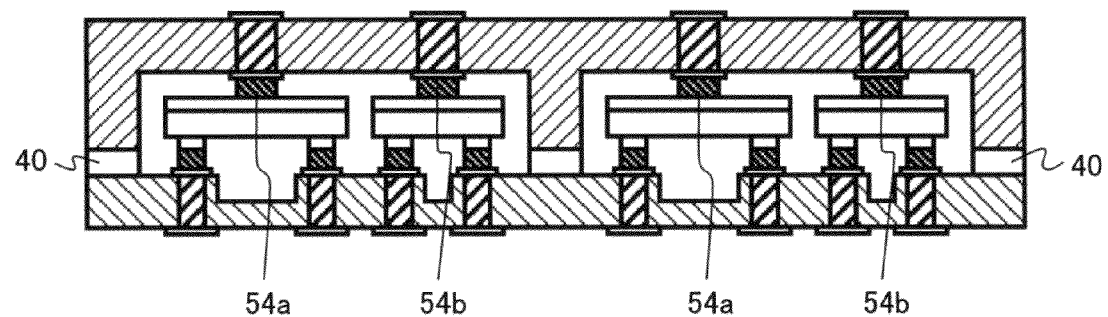

Next, FIGS. 5A and 5B illustrate the connection between the back-side ground surfaces (the back electrodes) 16 and 20 formed on the back-sides of the first and second semiconductor chips 10 and 12 and the back-side cap portion. As described above, the paste of the bonding material is coated on a part of the back-side cap portion 36, and the first and second back-side connecting portions 54a and 54b are formed through the method described above.

At this time, through the formation of the first and second back-side connecting portions 54a and 54b, the air gap is formed between the first and second semiconductor chips 10 and 12 and the second high-resistive silicon wafer 70.

Herein, since the back-side ground surfaces 16 and 20 are plated with Au on each one side thereof, there is no problem in that a short circuit occurs in the ground surface. Therefore, it is not necessary to form the bumps toward the first and second semiconductor chips 10 and 12. After the process, the first and second semiconductor chips 10 and 12 are formed such that all of signal lines, DC bias lines, and ground lines are drawn outside through the silicon cap portions 26 and 36.

Further, even the bonding material and the bonding method to be employed for the bonding portion 42 between the front-side cap portion 26 and the back-side cap portion 36 can employ the similar material and method of the first and second front-side connecting portions 50a, 50b, 52a, and 52b, or the first and second back-side connecting portions 54a and 54b. However, in order to prevent the front-side cap portion 26 and the back-side cap portion 36 from being electrically conducted, the bonding portion 40 is preferably formed using an insulating resin or the like.

Figure 6:
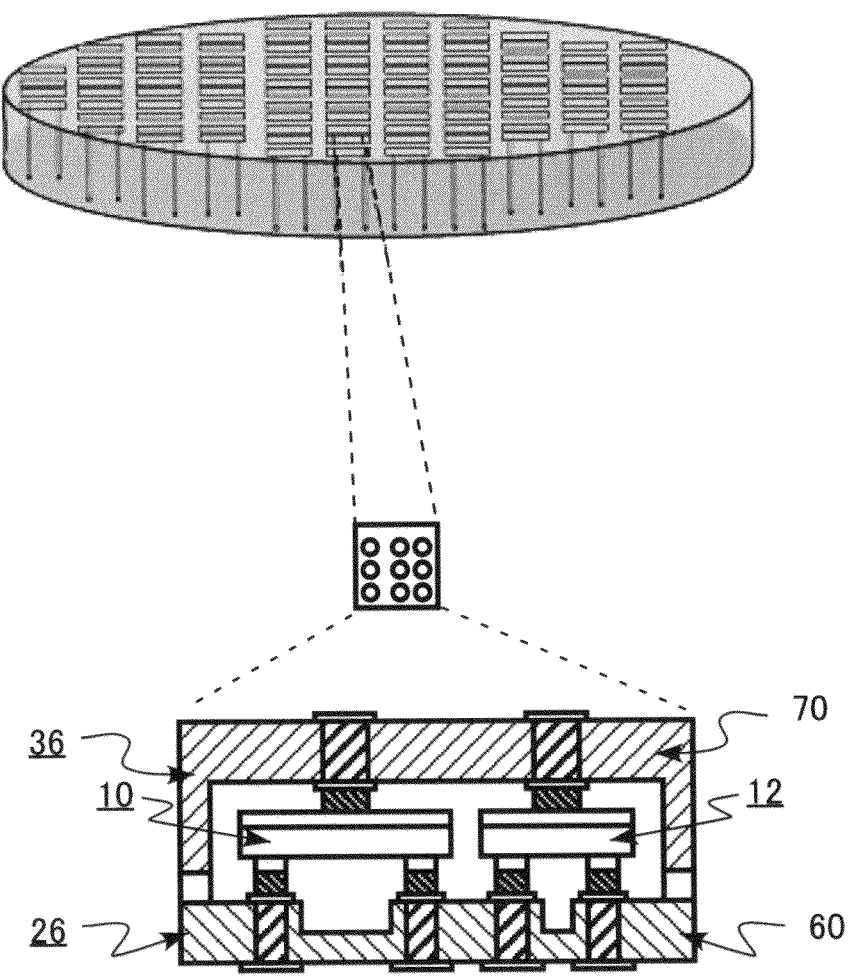
FIG. 6 is a diagram schematically illustrating a first wafer and a second wafer as viewed at a wafer level after being bonded to each other.

FIG. 6 is a diagram schematically illustrating a first wafer and a second wafer as viewed at a wafer level after being bonded to each other.

Figure 7A:
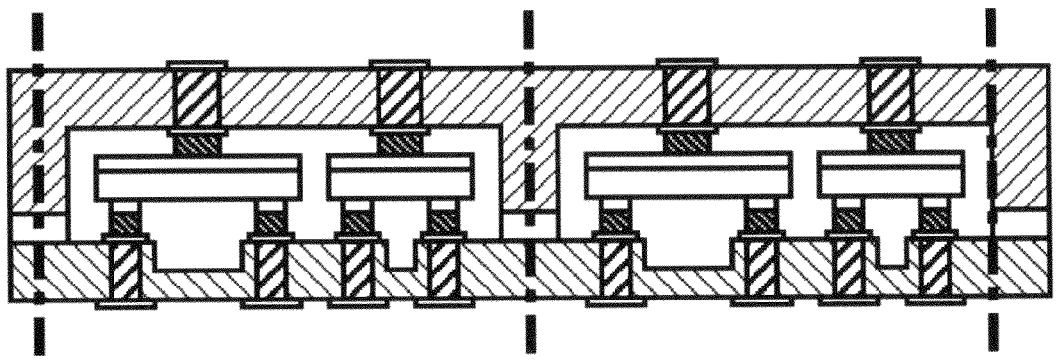
FIGS. 7A and 7B are cross-sectional views for explaining steps in a method of manufacturing a semiconductor package according to an embodiment.
Figure 7B:
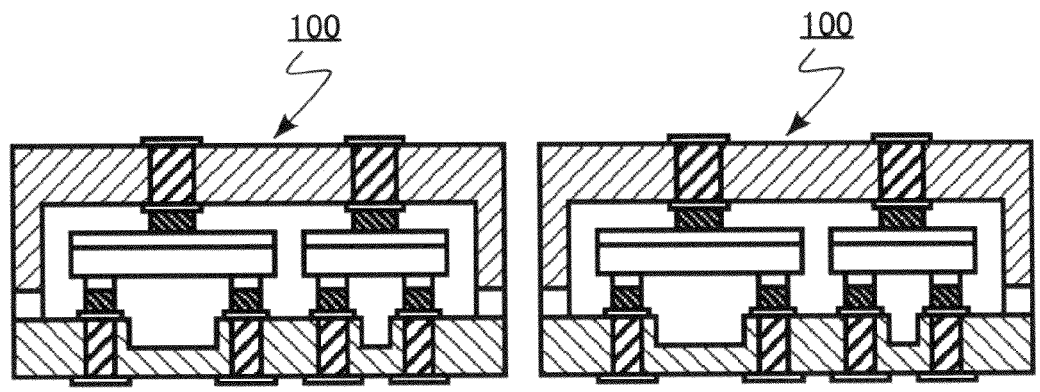

FIGS. 7A and 7B are cross-sectional views for explaining steps in a method of manufacturing the semiconductor package according to the embodiment. As illustrated in FIGS. 5A, 5B, and 6, after bonding the first high-resistive wafer 60 and the second high-resistive wafer 70, a dicing process is performed along dicing lines (the chain lines in the drawing). Therefore, a plurality of the semiconductor packages 100 formed on the wafer are individually obtained.

As described above, the semiconductor package 100 which includes a pseudo hermetic shield has been formed. According to the manufacturing method described above, a number of the semiconductor packages can be simultaneously formed in the wafer process, and even an examination process can be performed at the wafer level. Therefore, a manufacturing process is simplified, and the semiconductor package can be manufactured with a low cost, a high production yield, and a high performance.

Figure 8:
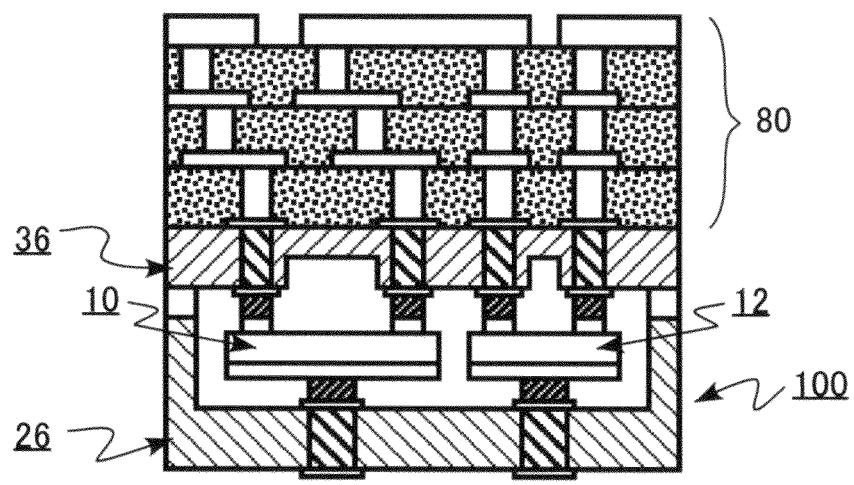
FIG. 8 is a cross-sectional view for explaining steps in a method of manufacturing a semiconductor package according to an embodiment.

FIG. 8 is a cross-sectional view for explaining steps in the method of manufacturing the semiconductor package according to the embodiment. After the formation of the semiconductor package 100 at the wafer level and before the dicing process, for example, as illustrated in FIG. 8, a multilayered interconnection layer 80 can be provided on the semiconductor package 100.

The multilayered interconnection layer 80, for example, is formed by interlayer resin films, gold vias, metal lines, and the like. The multilayered interconnection layer 80, for example, connects the electrodes of the first semiconductor chip 10 and the second semiconductor chip 12 in the same semiconductor package 100.

EXAMPLES

Herein below, examples will be described.

Example 1

Figure 9A:
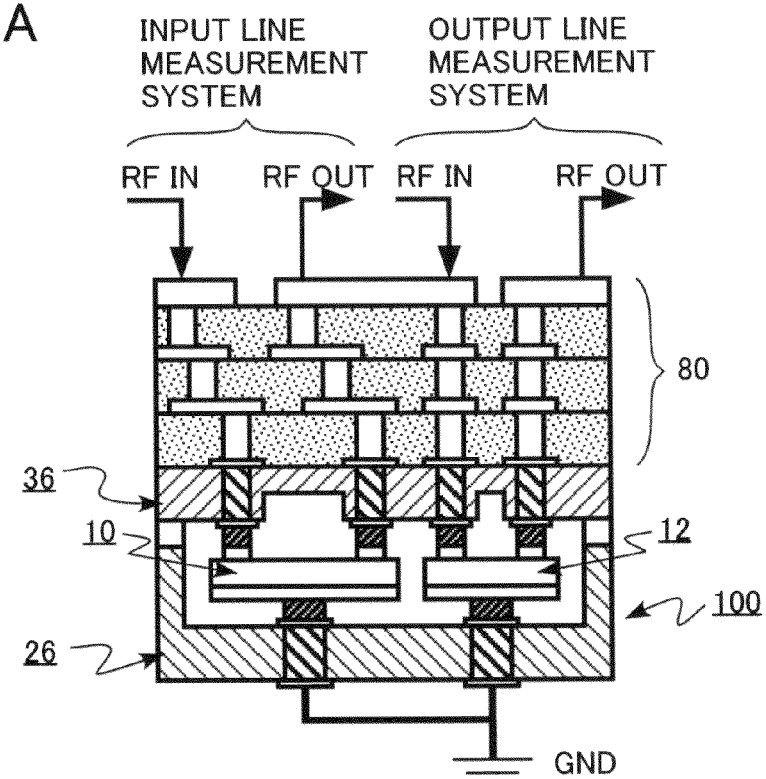
FIGS. 9A and 9B respectively are a diagram schematically illustrating a semiconductor package according to Example 1 and an evaluation result.
Figure 9B:
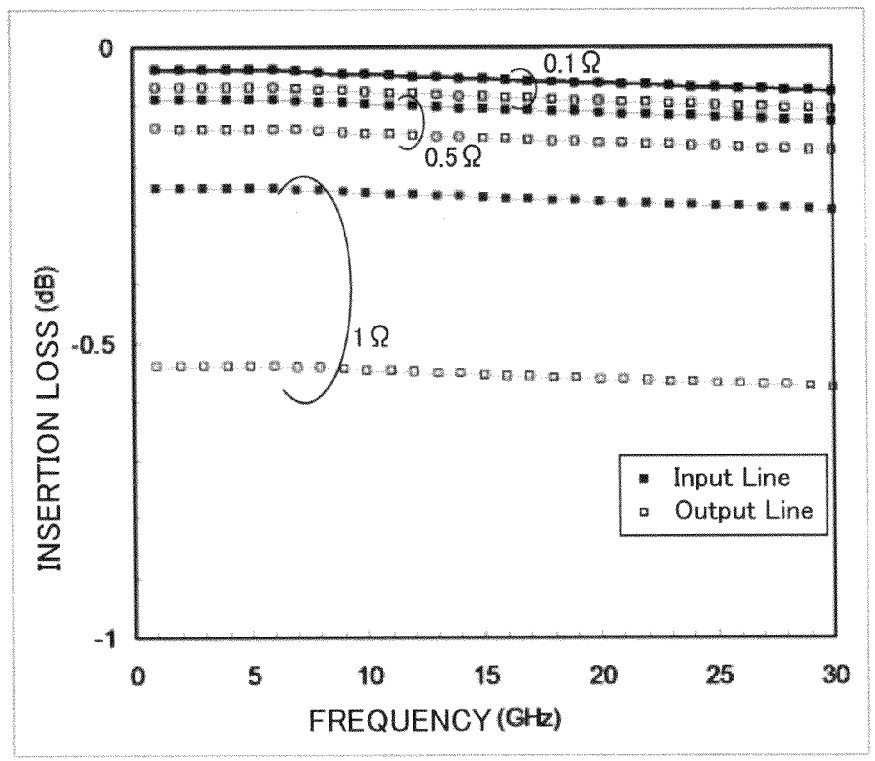

Example 1 shows an exemplary configuration of a package of an X-band frequency MMIC chip in which the front-side cap portion and the back-side cap portion are formed using a high-resistive silicon. FIGS. 9A and 9B are cross-sectional views schematically illustrating a semiconductor package according to Example 1 and an evaluation result thereof. FIG. 9A is the cross-sectional view schematically illustrating the semiconductor package 100, and FIG. 9B is a diagram illustrating the evaluation result on the insertion loss in a high-frequency signal between input and output terminals.

The process steps in the example are similar to those of the embodiment. The drawing illustrates that the process steps have been implemented up to rewiring through the multilayered interconnection layer 80 after the packaging.

FIG. 9B illustrates contact resistance dependency between back-side ground terminals where the insertion loss occurs. Referring to FIG. 9B, in a case where a low contact resistance of about $0.1\Omega$ is secured, a low insertion loss is maintained in both transmitting and receiving systems (input and output line systems), and thus it can be seen that the semiconductor package 100 according to Example 1 is effectively improved in electrical characteristics.

Example 2

Example 2 shows an exemplary configuration of the package for two kinds of semiconductor chips having mutually-different thicknesses. The process steps in the example are basically similar to those of Example 1 except that the shape of the cap portion is different and the back-side cap portion is formed with a difference in D-RIE thickness.

Figure 10:
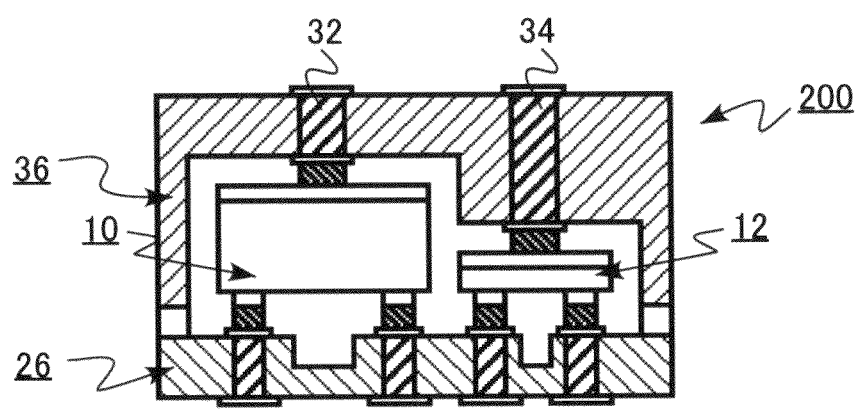
FIG. 10 is a cross-sectional view schematically illustrating a semiconductor package according to Example 2.

FIG. 10 is a cross-sectional view schematically illustrating a semiconductor package according to Example 2. As illustrated in the drawing, a semiconductor package 200 according to Example 2 is configured such that the thickness of the back-side cap portion 36 increases, where the back-side cap portion 36 faces the second semiconductor chip 12 which is a smaller one in thickness among the first and second semiconductor chips 10 and 12. At the same time, the depth of the second back-side penetrating electrode 34 among the first and second back-side penetrating electrodes 32 and 34 decreases, where the back-side cap portion 34 faces the second semiconductor chip 12.

Figure 11A:
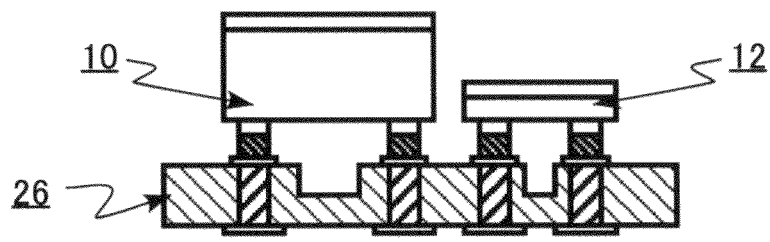
FIGS. 11A to 11C are cross-sectional views for explaining steps in a method of manufacturing a semiconductor package according to Example 2.
Figure 11B:
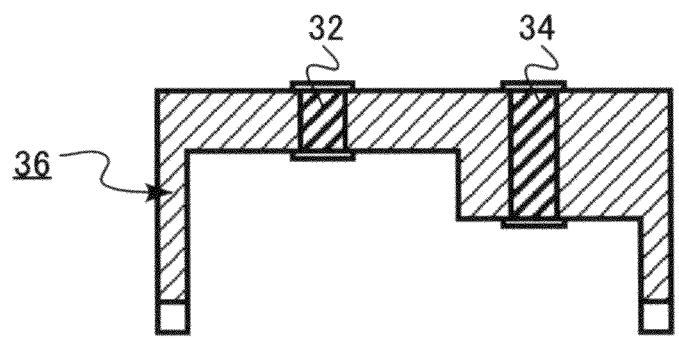
Figure 11C:
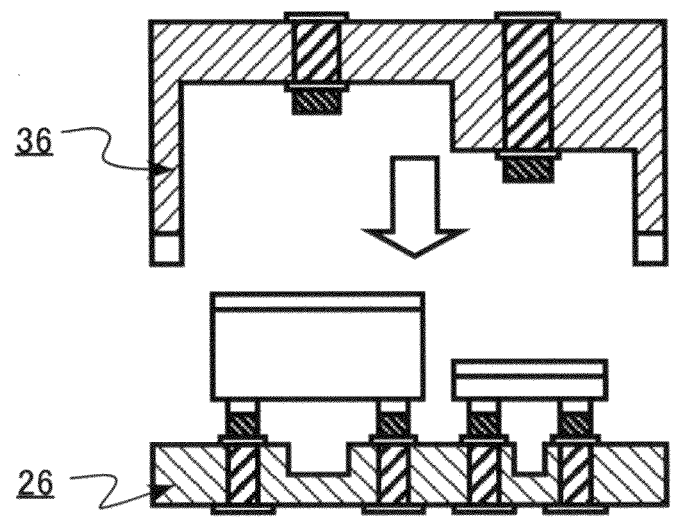

FIGS. 11A to 11C are cross-sectional views for explaining steps in the method of manufacturing the semiconductor package according to Example 2. The concave portions are formed such that the back-side cap portion 36 facing the thin second semiconductor chip 12 becomes thick to make a difference in depth through the D-RIE, and thus the first and second back-side penetrating electrodes 32 and 34 having mutually-different thicknesses are formed. Thereafter, the front-side cap portion 26 and the back-side cap portion 36 are bonded to each other.

According to Example 2, it is possible to easily package two kinds of semiconductor chips having mutually-different thicknesses.

Figure 12:
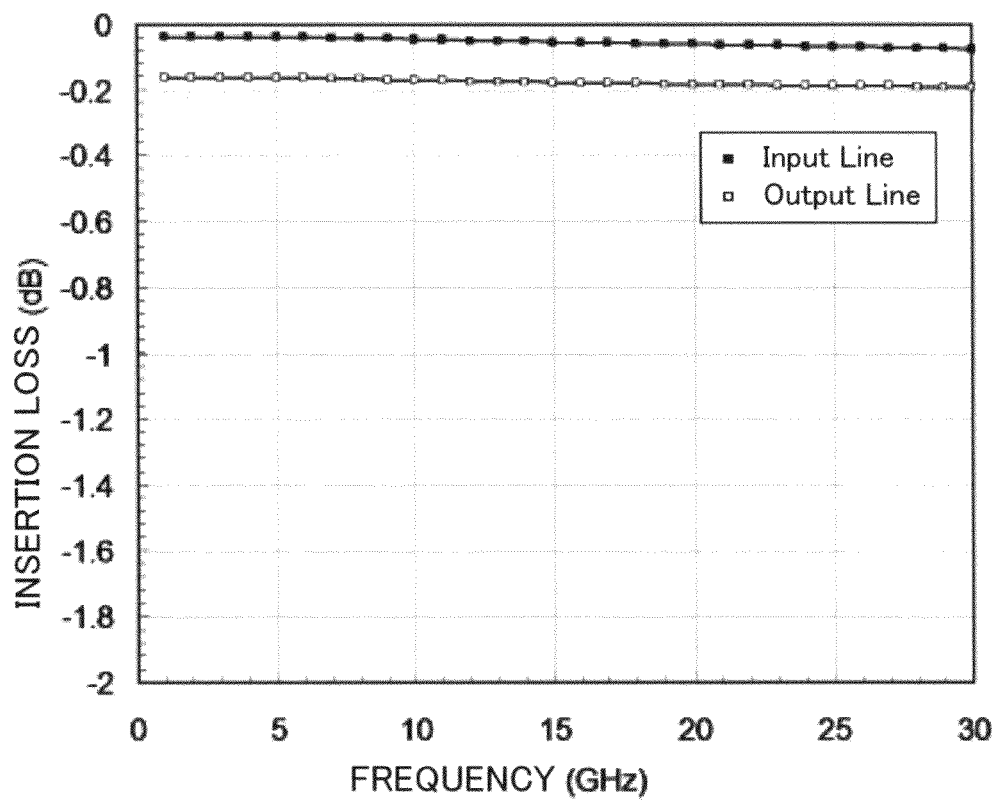
FIG. 12 is a diagram illustrating an evaluation result on insertion loss in a radio-frequency signal between an input terminal and an output terminal according to Example 2.

FIG. 12 is a diagram illustrating an evaluation result on insertion loss in a radio-frequency signal between an input terminal and an output terminal according to Example 2. Similarly to Example 1, after the multilayered interconnection layer is provided, the similar evaluation has been performed. Referring to the drawing, a low insertion loss is maintained in both transmitting and receiving systems, and thus it can be seen that the semiconductor package 200 according to Example 2 is effectively improved in electrical characteristics.

Example 3

Example 3 shows another exemplary configuration of the package for two kinds of semiconductor chips having mutually-different thicknesses. In the example, the through hole is formed using a photosensitive resin for the connection of the thinner one among the chips having mutually-different thicknesses. The process steps in Example 3 are basically similar to those of Example 1 except the patterning of the photosensitive resin and the filling of a conductive material into the through hole.

Figure 13:
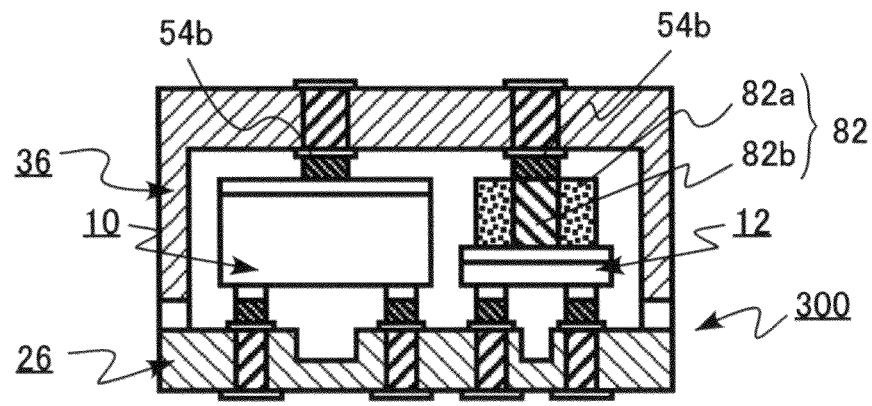
FIG. 13 is a cross-sectional view schematically illustrating a semiconductor package according to Example 3.
Figure 14A:
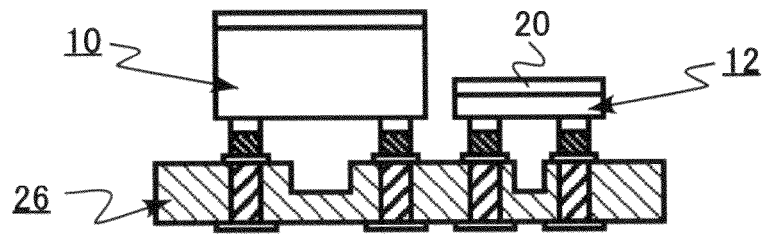
FIGS. 14A to 14D are cross-sectional views for explaining steps in a method of manufacturing a semiconductor package according to Example 3.
Figure 14B:
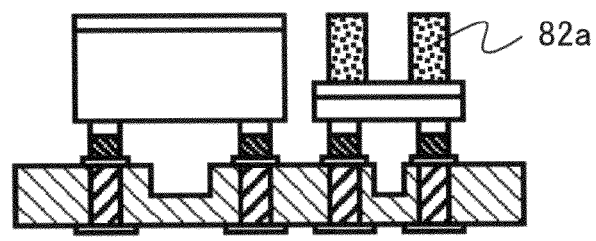
Figure 14C:
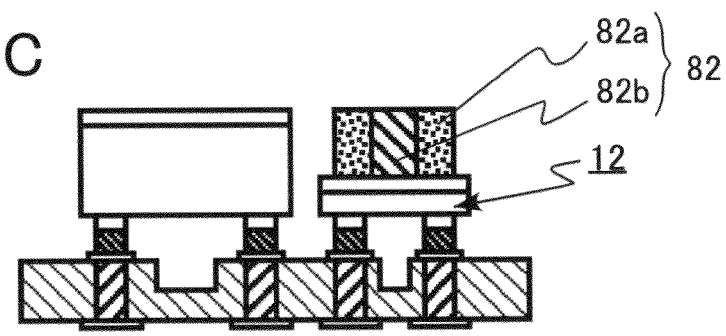
Figure 14D:
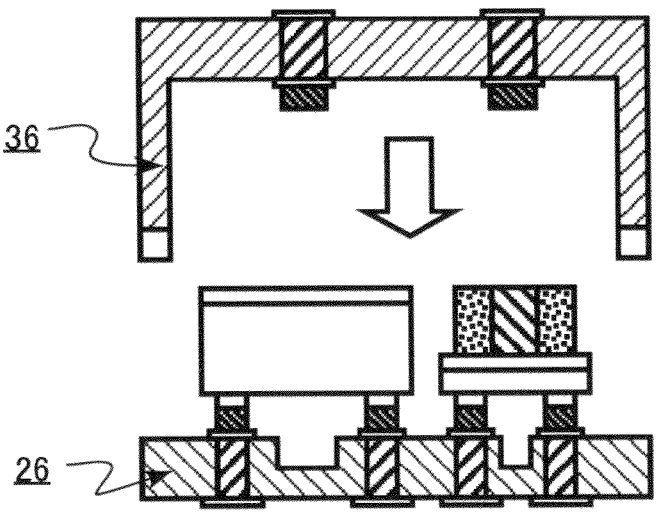

FIG. 13 is a cross-sectional view schematically illustrating a semiconductor package according to Example 3. As illustrated in the drawing, a semiconductor package 300 according to Example 3 includes a back-side connecting member 82 facing the second semiconductor chip 12 which is a smaller one in thickness among the first and second semiconductor chips 10 and 12. The back-side connecting member 82 includes a resin 82*a* and a conductive member 82*b* which passes through the resin 82*a*.

FIGS. 14A to 14D are cross-sectional views for explaining steps in a method of manufacturing the semiconductor package according to Example 3. The patterning of the photosensitive resin 82*a*, the forming of the through hole, and the filling of the conductive material 82*b* are performed on the back electrode 20 of the thin second semiconductor chip 12. Thereafter, the front-side cap portion 26 and the back-side cap portion 36 are bonded to each other.

According to Example 3, it is possible to easily package two kinds of semiconductor chips having mutually-different thicknesses.

Figure 15:
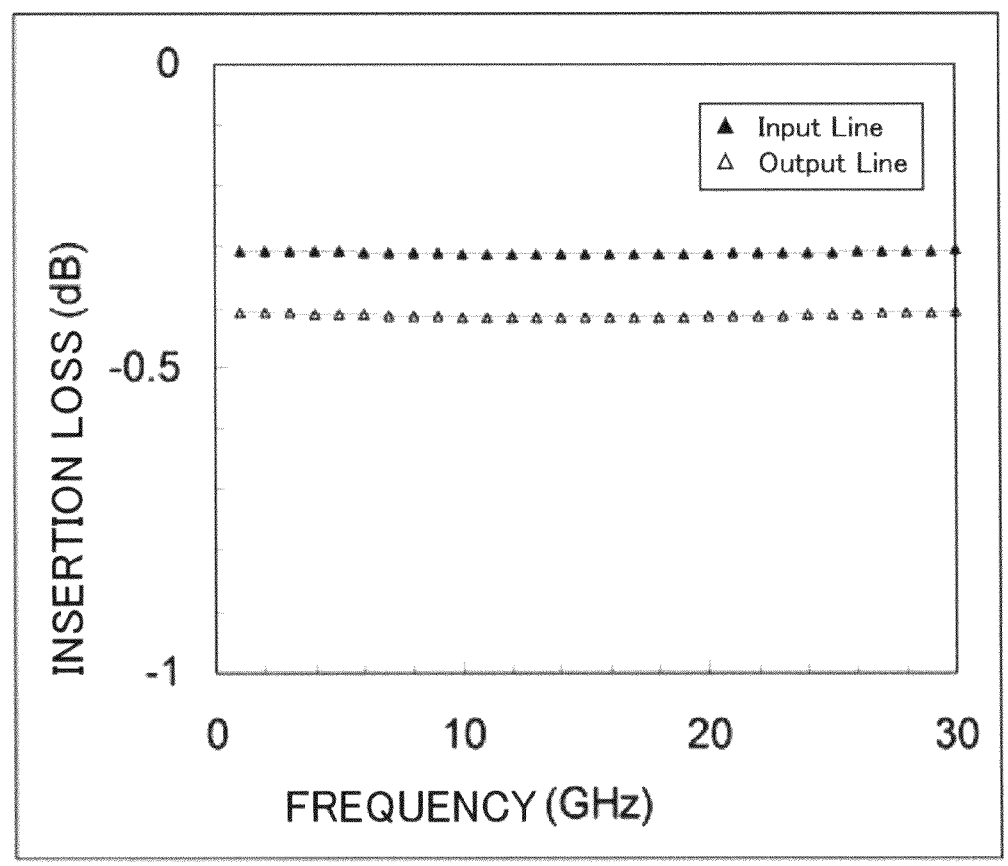
FIG. 15 is a diagram illustrating an evaluation result on insertion loss in a radio-frequency signal between an input terminal and an output terminal according to Example 3.

FIG. 15 is a diagram illustrating an evaluation result on insertion loss in a radio-frequency signal between an input terminal and an output terminal according to Example 3. Similarly to Example 1, after the multilayered interconnection layer is provided, the similar evaluation has been performed. Referring to the drawing, a low insertion loss is maintained in both transmitting and receiving systems, and thus it can be seen that the semiconductor package 300 according to Example 3 is effectively improved in electrical characteristics.

Example 4

Example 4 shows a reassembly example in which the semiconductor package 100 according to Example 1 is subjected to a reassembly using a non-photosensitive resin together with another semiconductor chip. This structure is a so-called pseudo-SOC structure. The process steps in Example 4 are basically similar to those of Example 1 except the reassembly.

Figure 16:
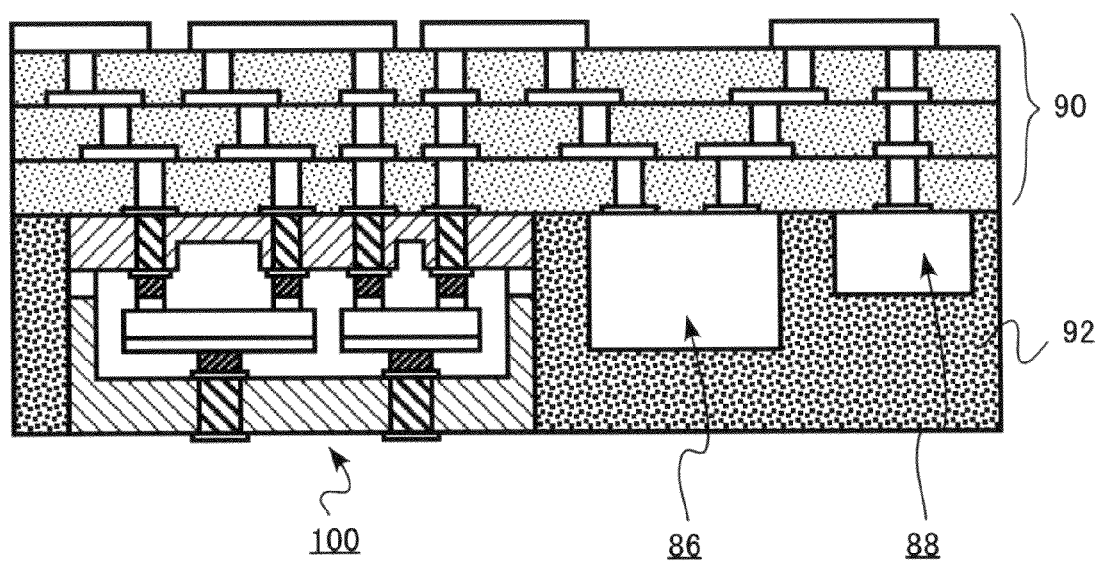
FIG. 16 is a cross-sectional view schematically illustrating a pseudo-SOC structure according to Example 4.

FIG. 16 is a cross-sectional view schematically illustrating the pseudo-SOC structure according to Example 4. The semiconductor package 100 is bonded with semiconductor chips 86 and 88, for example, logic devices, memory devices, diodes, and the like together with a resin layer 92. Then, the respective electrodes are connected to each other through a multilayered interconnection layer 90.

Figure 17A:
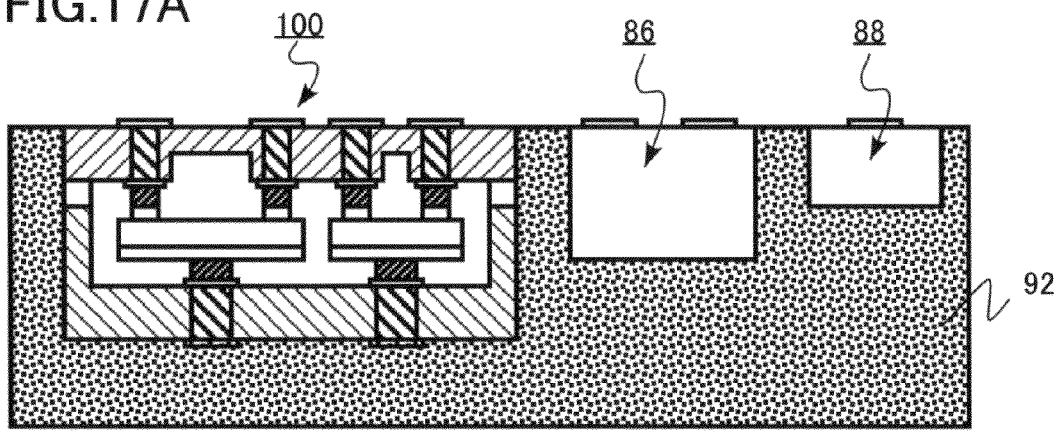
FIGS. 17A to 17C are cross-sectional views for explaining steps in a method of manufacturing a semiconductor package according to Example 4.
Figure 17B:
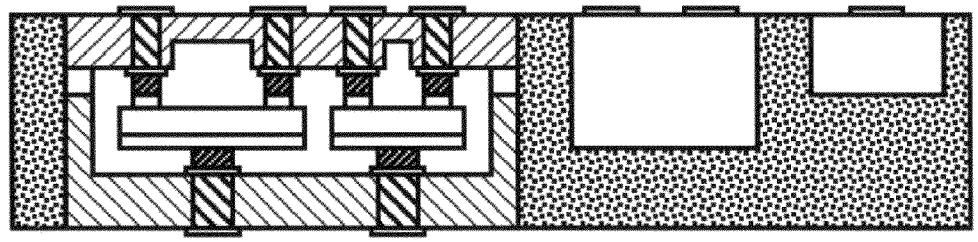
Figure 17C:
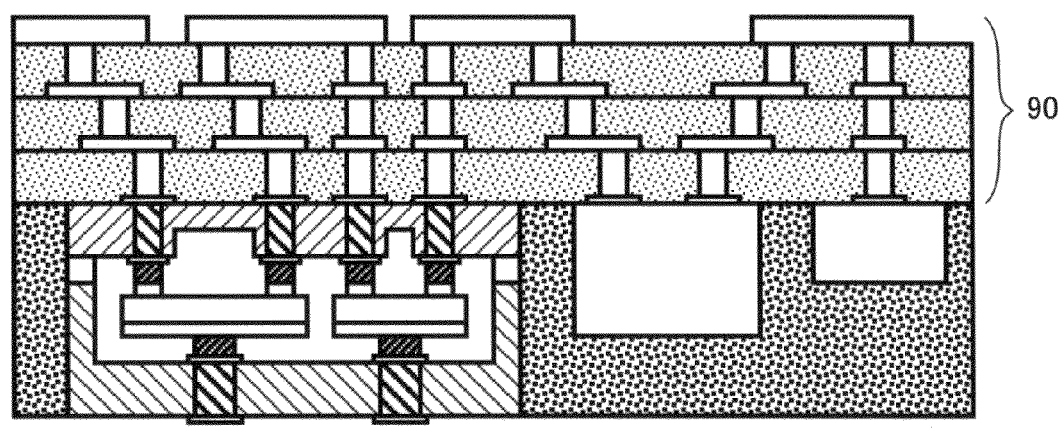

FIGS. 17A to 17C are cross-sectional views illustrating steps in a method of manufacturing a semiconductor package according to Example 4. The semiconductor package 100, the semiconductor chip 86, and the semiconductor chip 88 are arranged, for example, on a glass substrate (not illustrated) to make the front surface come in contact with the glass substrate, and are hermetically sealed using the resin layer 92 from the back surface (FIG. 17A).

Next, the resin layer 92 is abraded from the back surface side to be planarized (FIG. 17B). Thereafter, the multilayered interconnection layer 90 is formed, and thus the pseudo-SOC structure is completed (FIG. 17C).

Figure 18:
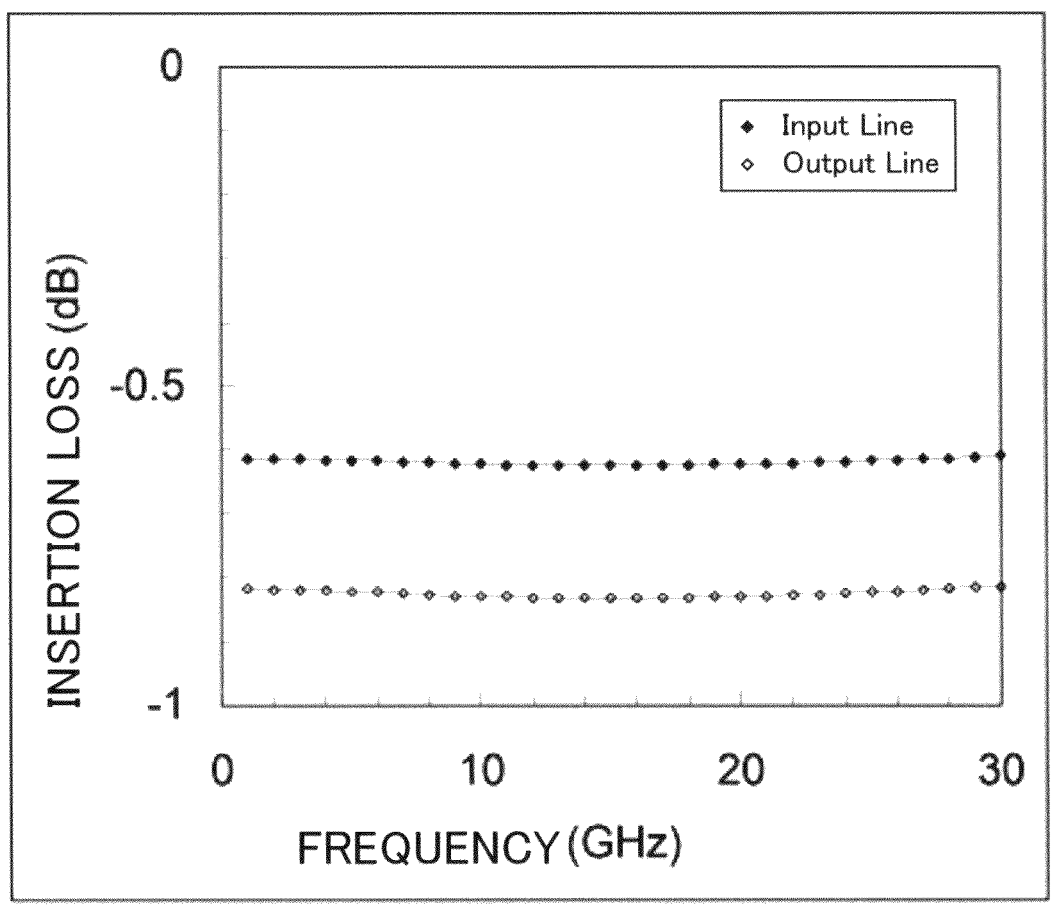
FIG. 18 is a diagram illustrating an evaluation result on insertion loss in radio-frequency signals between an input terminal and an output terminal according to Example 4.

FIG. 18 is a diagram illustrating an evaluation result on insertion loss in radio-frequency signals between an input terminal and an output terminal according to Example 4. The similar evaluation to Example 1 has been performed on the semiconductor package 100. Referring to the drawing, a low insertion loss is maintained in both transmitting and receiving systems, and thus it can be seen that the pseudo-SOC structure using the semiconductor package 100 according to Example 4 is effectively improved in electrical characteristics.

Besides the examples described above, various selections can be made in the conductive cap layer, the plating material, the resin material for hermetical sealing, the resin material for the formation of the input and output interconnections, and the metal material for the input and output interconnections. Further, multilayered films formed in another structure, conductive organic resin materials, functionally gradient materials, and the like can also be considered to be formed in module types satisfying each design specification. In addition, depending on the selection in the material, various kinds of conductive films can be formed through a damascene process or the like. Further, the widened applicable scope of the disclosure enables the semiconductor chip to be widely applicable to various semiconductor chips such as logic devices, memory devices, power devices, optical devices, MEMS devices, and sensor devices as well as the high-frequency devices.

In embodiments described above, the silicon (Si) has been exemplarily described as the semiconductor material which is used as the material of the cap portion, but the semiconductor material is not limited to the silicon (Si), and other single element semiconductors such as germanium (Ge) or compound semiconductors such as silicon carbide (SiC), gallium nitride (GaN), and gallium arsenide (GaAs) can be used.

While certain embodiments have been described, these embodiments have been presented by way of example only, and are not intended to limit the scope of the inventions. Indeed, the semiconductor package and the method of manufacturing the semiconductor package described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor package, comprising:
    a semiconductor chip including a front electrode on a front surface thereof and a back electrode on a back surface thereof;
    a front-side cap portion being positioned to face the front surface of the semiconductor chip, a first air gap exists in a portion between the semiconductor chip and the front-side cap portion, the front-side cap portion includes a front-side penetrating electrode;
    a back-side cap portion being positioned to face the back surface of the semiconductor chip, the back-side cap portion being bonded with the front-side cap portion to hermetically seal the semiconductor chip, a second air gap exists in a portion between the semiconductor chip and the back-side cap portion, the back-side cap portion includes a back-side penetrating electrode;

a front-side connecting portion which electrically connects the front electrode and the front-side penetrating electrode;

a back-side connecting portion which electrically connects the back electrode and the back-side penetrating electrode; and a barrier metal layer provided between the back-side penetrating electrode and the back-side connecting portion, the barrier metal layer being in contact with both the back-side penetrating electrode and the back-side connecting portion, the barrier metal layer preventing oxidation of the back-side penetrating electrode.

2. The semiconductor package according to claim 1, wherein the semiconductor chip is a high-frequency semiconductor chip.

3. The semiconductor package according to claim 1, wherein a material of the front-side cap portion and the back-side cap portion is silicon.

4. The semiconductor package according to claim 1, wherein the front-side penetrating electrode and the back-side penetrating electrode contain copper (Cu).

5. A semiconductor package, comprising:
a semiconductor chip including a front electrode on a front surface thereof and a back electrode on a back surface thereof;
a front-side cap portion being positioned to face the front surface of the semiconductor chip, a first air gap exists in a portion between the semiconductor chip and the front-side cap portion, the front-side cap portion includes a front-side penetrating electrode;
a back-side cap portion being positioned to face the back surface of the semiconductor chip, the back-side cap portion being bonded with the front-side cap portion to hermetically seal the semiconductor chip, a second air gap exists in a portion between the semiconductor chip and the back-side cap portion, the back-side cap portion includes a back-side penetrating electrode;
a front-side connecting portion which electrically connects the front electrode and the front-side penetrating electrode;
a back-side connecting portion which electrically connects the back electrode and the back-side penetrating electrode; and
a connecting member formed by a resin and a conductive material passing through the resin between the back-side connecting portion and the back electrode.

6. A semiconductor package, comprising:
a first semiconductor chip including a first front electrode on a front surface thereof and a first back electrode on a back surface thereof;
a second semiconductor chip including a second front electrode on the front surface and a second back electrode on the back surface thereof;
a front-side cap portion being positioned to face the front surface of the first and second semiconductor chips, a first air gap exists in a portion between the first and second semiconductor chips and the front-side cap portion, the front-side cap portion includes first and second front-side penetrating electrodes;
a back-side cap portion being positioned to face the back surface of the first and second semiconductor chips, the back-side cap portion being bonded with the front-side cap portion to hermetically seal both the first and second semiconductor chips in the same hollow portion, a second air gap exists in a portion between the first and second semiconductor chips and the back-side cap portion, the back-side cap portion includes first and second back-side penetrating electrodes;
first and second front-side connecting portions which electrically connect the first and second front electrodes and the first and second front-side penetrating electrodes, respectively; and
first and second back-side connecting portions which electrically connect the first and second back electrodes and the first and second back-side penetrating electrodes.

7. The semiconductor package according to claim 6, wherein a thickness of the second semiconductor chip is thinner than that of the first semiconductor chip, and
a connecting member is provided between the second back-side connecting portion and the second back electrode, the connecting member being formed by a resin and a conductive material passing through the resin.

8. The semiconductor package according to claim 6, wherein the first and second semiconductor chips are a high-frequency semiconductor chip.

9. The semiconductor package according to claim 6, wherein a material of the front-side cap portion and the back-side cap portion is silicon.

10. The semiconductor package according to claim 6, wherein the first and second front-side penetrating electrodes and the first and second back-side penetrating electrodes contain copper (Cu).

* * * * *